(12) United States Patent
Mullarkey et al.

(10) Patent No.: US 6,385,691 B2
(45) Date of Patent: *May 7, 2002

(54) MEMORY DEVICE WITH COMMAND BUFFER THAT ALLOWS INTERNAL COMMAND BUFFER JUMPS

(75) Inventors: Patrick J. Mullarkey, Meridian; Casey R. Kurth, Eagle; Scott J. Derner, Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/764,502

(22) Filed: Jan. 17, 2001

Related U.S. Application Data

(63) Continuation of application No. 09/146,412, filed on Sep. 3, 1998, now Pat. No. 6,192,446.

(51) Int. Cl.[7] .............................................. G06F 12/00
(52) U.S. Cl. ........................................ 711/105; 711/154
(58) Field of Search ................................. 711/105, 154

(56) References Cited

U.S. PATENT DOCUMENTS 6,032,220 A  *  2/2000  Martin et al. .................. 711/5

* cited by examiner

*Primary Examiner*—Jack A. Lane
(74) *Attorney, Agent, or Firm*—Williams, Morgan & Amerson, P.C.

(57) ABSTRACT

A memory device includes a memory array, a plurality of external lines, a command buffer, and control logic. The plurality of external lines is adapted for receiving an external command. The command buffer is adapted to store at least one command buffer entry. The control logic is coupled to the plurality of external lines and the command buffer. The control logic is adapted to access the memory array based on one of the command buffer entry and the external command. A method for providing commands to a memory device is provided. The memory device includes a command buffer, control logic and a memory array. The method includes reading a first buffered command from the command buffer. The first buffered command is provided to the control logic. The memory array is accessed based on the first buffered command.

19 Claims, 4 Drawing Sheets

| NAME (FUNCTION) | CS# | RAS# | CAS# | WE# | ADDR | DQs |
|---|---|---|---|---|---|---|
| COMMAND INHIBIT (NOP) | H | X | X | X | X | X |
| NO OPERATION (NOP) | L | H | H | H | X | X |
| ACTIVE (Select bank and activate row) | L | L | H | H | Bank/Row | X |
| READ (Select bank and column, and start READ burst) | L | H | L | H | Bank/Col | X |
| WRITE (Select bank and column, and start WRITE burst) | L | H | L | L | Bank/Col | Valid |
| BURST TERMINATE | L | H | H | L | X | Active |
| PRECHARGE (Deactivate row in bank or banks) | L | L | H | L | Code | X |
| AUTO REFRESH (CKE High) or SELF REFRESH (CKE Low) | L | L | L | H | X | X |
| LOAD MODE REGISTER | L | L | L | L | Op-Code | X |
| LOAD COMMAND SET | L | L | L | L | A7-H A8-L A0-A6 Com Buffer Address | Com Buffer Entry |
| START COMMAND SET | L | L | L | L | A7-L A8-H A0-A6 Com Buffer Address | X |
| STOP COMMAND SET | L | L | L | L | A7-H A8-H | X |

Figure 3

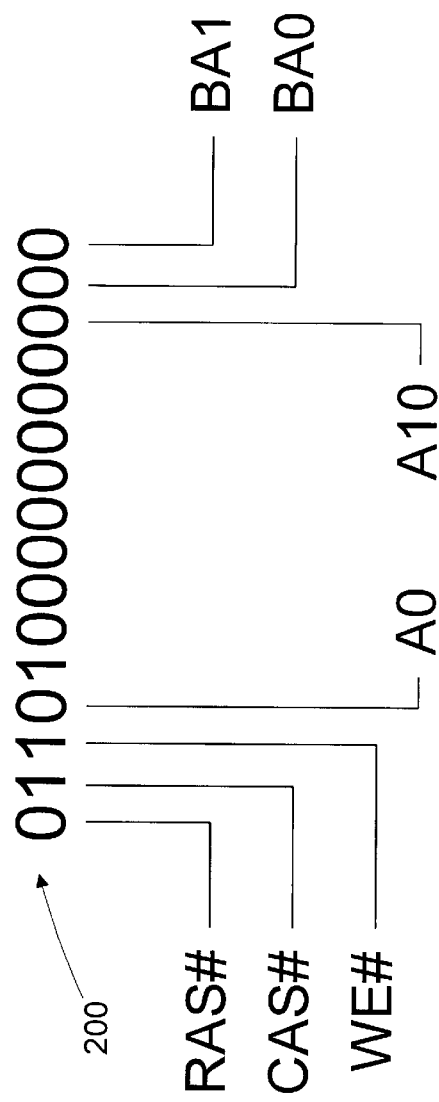

MEMORY DEVICE WITH COMMAND BUFFER THAT ALLOWS INTERNAL COMMAND BUFFER JUMPS

This application is a continuation of U.S. patent application Ser. No. 09/146,412, filed Sep. 3, 1998, now U.S. Pat. No. 6,192,446.

BACKGROUND OF THE INVENTION

1. Field of the Invention

This invention relates generally to memory devices, and more particularly, to a memory device having a command buffer for storing commands to be executed by the memory device independent of its external command input signals.

2. Description of the Related Art

Memory devices, such as dynamic random access memories (DRAM), synchronous dynamic random access memories (SDRAM), static random access memories (SRAM), and the like have been widely used to provide random memory for use by a microprocessor in a computer system. Typically, a series of commands are issued to the memory device to access its storage locations (i.e., cells) to read or write data. The access may be a discrete single cell access, or alternatively the access might read or write to a plurality of cells with a single command (e.g., a burst access or block access). In response to the series of commands, the memory device reads or writes the appropriate data.

Typically a memory controller receives memory requests from the microprocessor and issues memory access commands to the memory device. The memory controller provides row and column addresses to the memory device to specify the desired memory cell or cells in the system memory to be accessed based on the memory request. The memory controller also provides one or more logic signals that communicate the type of command (e.g., read or write, etc.) to the memory device. For each command, the memory controller must drive the address and logic signal lines to communicate the command to the memory device.

Driving the address and logic signals for each command consumes electrical power. In some computer systems, such as notebook systems, it is important to conserve electrical power, when possible, to extend the operating time provided by the battery. One power conservation technique involves de-energizing devices or portions of a memory device when it is not being accessed. For example, memory devices often include two or more banks of storage cells that may be independently accessed. To conserve power, logic supporting the unused bank may be powered down. Typically, the microprocessor is constantly reading from or writing to the memory device. Although, unused portions of the memory device may be powered down to conserve power, power is still required to drive the external address lines and logic signals for each command.

The present invention is directed to overcoming, or at least reducing the effects of, one or more of the problems set forth above.

SUMMARY OF THE INVENTION

One aspect of the present invention is seen in a memory device including a memory array, a plurality of external lines, a command buffer, and control logic. The plurality of external lines is adapted for receiving an external command. The command buffer is adapted to store at least one command buffer entry. The control logic is coupled to the plurality of external lines and the command buffer. The control logic is adapted to access the memory array based on one of the command buffer entry and the external command.

Another aspect of the present invention is seen in a method for providing commands to a memory device. The memory device includes a command buffer, control logic and a memory array. The method includes reading a first buffered command from the command buffer. The first buffered command is provided to the control logic. The memory array is accessed based on the first buffered command.

BRIEF DESCRIPTION OF THE DRAWINGS

Other objects and advantages of the invention will become apparent upon reading the following detailed description and upon reference to the drawings in which:

FIG. 3 is a truth table of commands that may be issued to the memory device of FIG. 2;

FIG. 4 is a diagram showing the partitioning of an entry in a command buffer of the memory device of FIG. 2; and FIG. 5 is a diagram showing a portion of the command buffer entries stored in the command buffer of FIG. 2.

Figure 1:
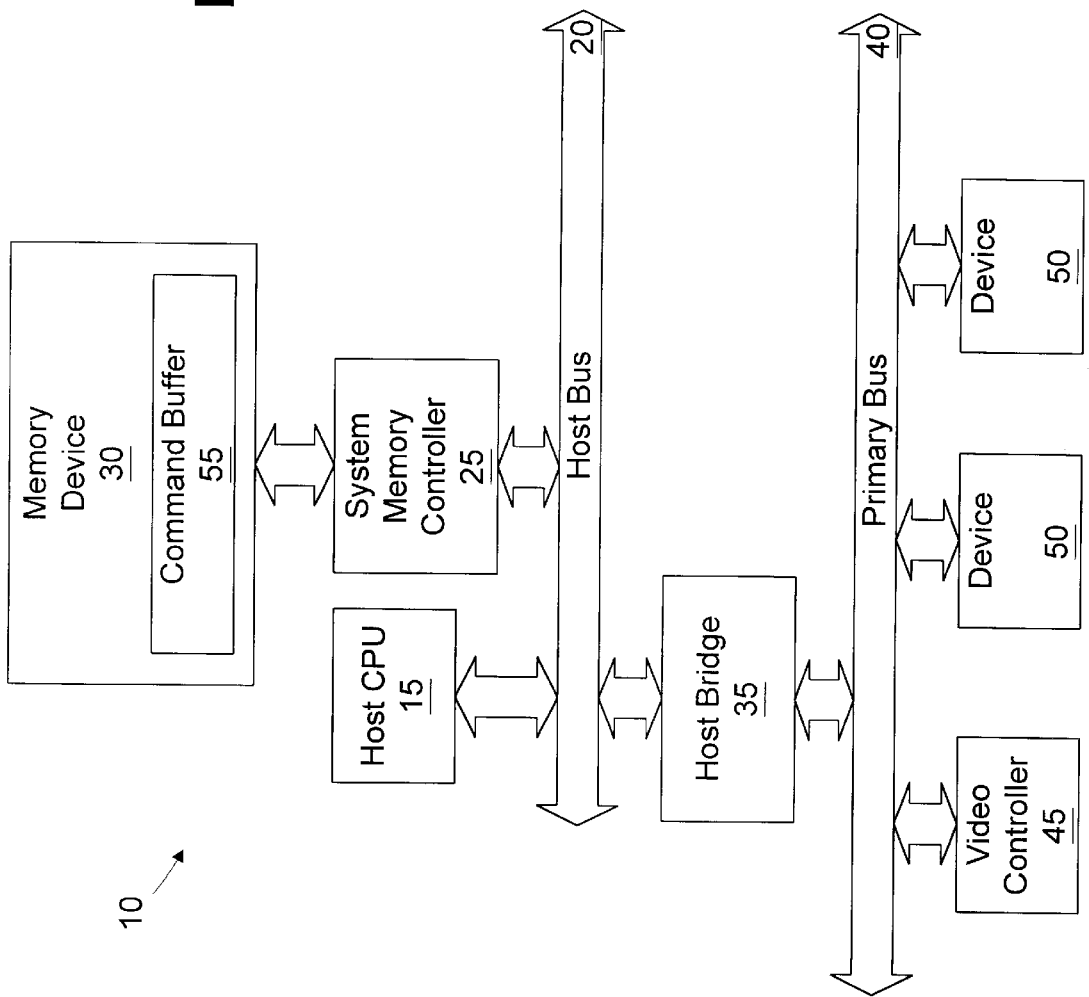
FIG. 1 is a block diagram of a computer system in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a block diagram of a computer system 10, is provided. The computer system 10 includes a microprocessor 15, which may include multiple processors (not shown), coupled to a host bus 20. A system memory controller 25 is coupled to the host bus 20 and a memory device 30. A host bridge 35 couples the host bus 20 to a primary bus 40, such as a peripheral component interconnect (PCI) bus (PCI Specification, Rev. 2.1). A video controller 45 and other devices 50 (e.g., PCI devices) are coupled to the primary bus 40. The computer system 10 may include other buses such as a secondary PCI bus (not shown) or other peripheral devices (not shown) known in the art.

The microprocessor 15 communicates with the memory device 30 through the system memory controller 25. The system memory controller 25 provides memory addresses and logic signals to the memory device 30 to characterize the desired memory transactions (e.g., read or write, burst or non-burst, etc.). The memory device 30 includes a command buffer 55 adapted to store a sequence of commands that may be internally executed by the memory device 30 to process a sequence of predefined memory transactions.

In the illustrated embodiment, the memory device 30 is a synchronous dynamic random access memory (SDRAM). Although the present invention is described in reference to an SDRAM, its application is not so limited. In light of the disclosure herein, the present invention may be adapted for use with any memory device 30, such as, but not limited to, a dynamic random access memory (DRAM), a static random access memory (SRAM), a flash memory, or the like.

Figure 2:
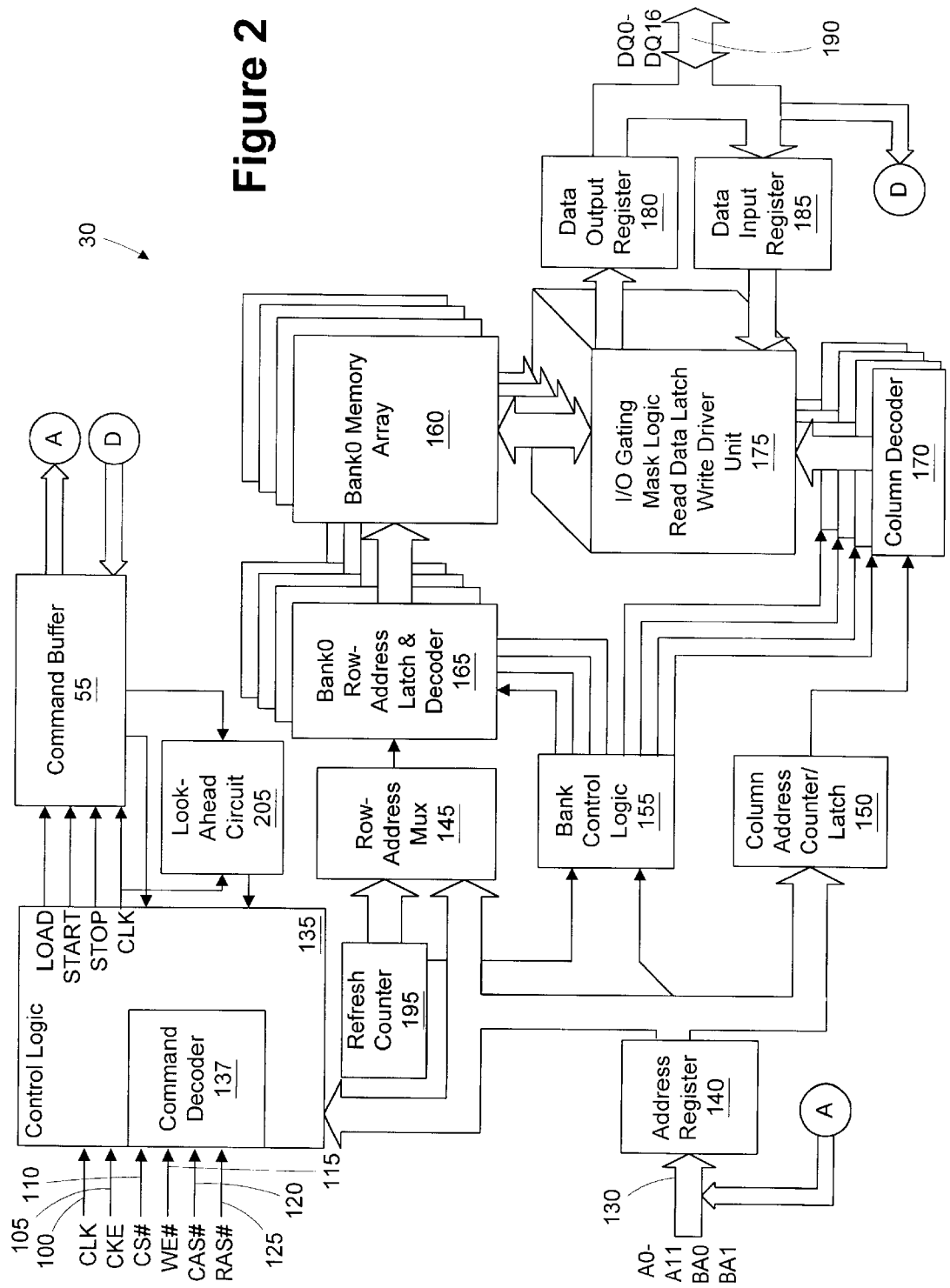
FIG. 2 is a block diagram of a memory device in the computer system of FIG. 1.

FIG. 2 illustrates a block diagram of the memory device 30. In the illustrated embodiment, the memory device 30 is burst oriented. Read and write accesses start at a selected location and continue for a programmed number of locations in a programmed sequence. The burst may terminate after a predetermined number of cells are accessed, or the burst may continue indefinitely until a burst terminate command is given. The memory device is synchronized with the microprocessor 15 and the system memory controller 25 by a clock signal (CLK) received on an external clock line 100. Commands issued to the memory device 30 are synchronized with the CLK signal (e.g., commands are issued on the rising edge of the CLK signal).

The memory device 30 also receives logic signals from the system memory controller 25. As used herein, a pound sign (#) suffix on a logic signal name indicates that the logic signal is asserted low (i.e., a logic 0 indicates assertion, a logic 1 indicates de-assertion). The logic signals include a clock enable (CKE) signal on an external line 105, a chip select signal (CS#) on an external line 110, a write enable signal (WE#) on an external line 115, a column address select signal (CAS#) on an external line 120, and a row address select signal (RAS#) on an external line 125. The memory device 30 receives address information on external address lines 130. The address information includes twelve address bits (A0–A11) and two bank select bits (BA0 AND BA1).

Control logic 135 receives the CKE, CLK, CS#, WE#, CAS#, and RAS# signals. A command decoder 137 within the control logic 135 receives the CS#, WE#, CAS#, and RAS# signals and determines the desired command based on the logical combination of the signals.

FIG. 3 illustrates a truth table of the commands as defined by the logic signals. The commands include standard commands 138, which are commands well known to those of ordinary skill in the art for accessing a memory device 30, and command buffer commands 139, which relate exclusively to the operation of the command buffer 55.

Returning to FIG. 2, the memory device 30 also includes an address register 140 adapted to receive the address information on the external address lines 130. The address information includes row information and column information (received during successive cycles), which are stored in a row address multiplexer 145 and a column address counter/latch 150, respectively. The bank select bits, BA0, BA1 are received by bank control logic 155.

In the illustrated embodiment, the memory device 30 includes four bank memory arrays 160 (Bank0 through Bank3). Each bank memory array 160 has an associated bank row address latch and decoder 165 and a column decoder 170. The bank row address latch and decoder 165 receives row information from the row address multiplexer 145, and the column decoder 170 receives column information from the column address counter/latch 150. The bank control logic 155 selects one of the four bank memory arrays 160 based on the BA0 and BA1 address information and controls the bank row address latch and decoder 165 and column decoder 170 associated with the selected bank memory array 160.

An I/O gating, mask logic, read data latch, and write driver unit 175 interfaces with the bank memory arrays 160 and the column decoders 170 to coordinate data input and output. Data being read from the bank memory arrays 160 are stored in a data output register 180 and data being written to the bank memory arrays 160 are stored in a data input register 185. The memory device 30 includes external DQ lines 190 coupled to the data output register 180 and the data input register 185.

The memory device 30 includes a refresh counter 195 coupled to the row address multiplexer 145 and the bank control logic 155 for refreshing the rows in the bank memory arrays 160.

During operation, the memory device 30 receives a series of commands synchronized with the CLK signal. The series of commands may repeat periodically depending on the nature of the operations being performed by the microprocessor 15. Certain applications, such as graphics applications, are prone to have a greater degree of repeating command sequences. The command buffer 55 is adapted to store a sequence of commands based on command information programmed by the user of the computer system 10 including the memory device 30. The stored sequence is then accessed and executed by the memory device 30 without requiring the system memory controller 25 to drive the logic and address signals on the external lines 115, 120, 125, and 130. As a result, the system memory controller 25 consumes less power while the commands stored in the command buffer 55 are being executed. The use of the command buffer 55 to store and execute commands is described in greater detail below.

FIG. 4 illustrates the partitioning of a command buffer entry 200. The command buffer entry 200 includes the logic signals for the RAS# signal (bit 0), the CAS# signal (bit 1), the WE# signal (bit 2), the address bits (bits 3 through 13), and the bank address bits BA0, BA1 (bits 14 and 15). In the illustrated embodiment the CS# and CKE signals are not asserted during normal commands issued to the memory device 30, and accordingly they are not included in the command buffer entry 200 (i.e., they are assumed to be in a de-asserted state). It is contemplated that the CS# and CKE signals, or any other logic signals specific to an alternative memory device (not shown) may be included in the command buffer entry 200, depending on the specific memory device 30 and/or computer system 10 design. Signals not included in the command buffer entry 200 may be derived using default values or may be received from the appropriate external pin (not shown).

The commands stored in the command buffer 30 may be loaded during the startup sequence of the computer system 10, dynamically during the operation of the computer system 10, or statically coded in a non-volatile memory. Accordingly, the command buffer 30 may be any type of memory, such as random access memory (e.g., DRAM, SRAM, etc.), read only memory (e.g., flash memory, EEPROM, ROM), or any other type of storage device. It is also contemplated that a portion of the cells (not shown) in the bank memory arrays 160 may be reserved for storing the command buffer entries 200, rather than having a separate storage device.

The command buffer commands 139 (shown in FIG. 3) are used for accessing the command buffer 55. The operation of the command buffer 55 is illustrated by the following example. To load a command into the command buffer 55, the RAS#, CAS#, and WE# signals on the external lines 125, 120, 115 are held low. The address signal A7 is held high and the address signal A8 is held low on the external address lines 130. This combination represents the load command set operation shown in FIG. 3. The data on the address signals A0 through A6 on the external address lines 130 indicate the storage location within the command buffer 55 (i.e., seven bits equates to 128 storage locations, each having a length of sixteen bits as defined in FIG. 4). The data on the external DQ lines 190 define the command buffer entry 200 to be loaded at the specified location. Returning briefly to FIG. 2, the command buffer 55 is internally coupled to the external address lines 130 and the external DQ lines 190.

FIG. 5 illustrates a series of command buffer entries 200 available in the command buffer entry 200. A load command having address signals A0 through A6 on the external address lines 130 held at "000011" and external DQ lines 190 held at "0110100000000000" results in the command buffer entry 200 being loaded into the fourth location in the command buffer 55. Referring briefly to FIG. 3, the command being stored in the fourth location of the command buffer 55 is an ACTIVE command, where the address bits A0 through A10 in the command buffer entry 200 designate the row to be activated. The other command buffer entries 200 shown in FIG. 5 are designated as don't cares (X) because they have not been previously accessed. Alternatively, it is contemplated that default command buffer entries 200 may be loaded into the command buffer 55 during the startup sequence of the computer system 10. In that case the other command buffer entries 200 would be known (i.e., not X).

To start executing the commands stored in the command buffer 55, a start command set instruction (shown in FIG. 3) is issued. The RAS#, CAS#, and WE# signals on the external lines 125, 120, 115 are held low, the address signal A7 is low, and the address signal A8 is high on the external address lines 130. The data on the address signals A0 through A6 on the external address lines 130 indicate the storage location within the command buffer 55 of the command buffer entry 200 containing the first command in the desired sequence. Execution of the commands stored in the command buffer entries 200 commences one CLK cycle after the start command set instruction is registered by the control logic 135. A command buffer 55 pointer, which was initialized by the start command set instruction is incremented on every subsequent CLK cycle, and the corresponding next command stored in the subsequent command buffer entry 200 is executed by the memory device 30. The command buffer 55 pointer is incremented until either another start command set instruction or a stop command set instruction is received by the control logic 135.

During the execution of commands from the command buffer 55, the control logic 135 ignores the RAS#, CAS#, WE#, and address signals (i.e., A0–A11, BA0, BA1) on the external lines 115, 120, 125, 130 and instead uses the information stored in the command buffer entry 200 being executed, unless another start or stop command set instruction is received. However, the external DQ lines 190 are still enabled for data transfer to and from the memory device 30.

The stop command set instruction is generated by holding the RAS#, CAS#, and WE# signals on the external lines 125, 120, 115 low and the address signals A7 and A8 on the external address lines 130 high. After the stop command set command is registered by the control logic 135, operation of the memory device 30 proceeds in the typical fashion using the external logic lines 115, 120, 125 and the external address lines 130. It is contemplated that a series of commands may be made self-terminating by including a stop command set instruction in the command buffer 55.

If another start command set instruction is received by the control logic 135, the command buffer 55 pointer is reinitialized at the new location, and execution proceeds from the new command buffer entry 200. The issuing of successive start command set instructions may be used to emulate program jumps within the command buffer entries 200. It is contemplated that a series of commands may execute internal jumps by including a start command set instruction in the command buffer 55 at a desired jump point.

The command buffer 55 may be loaded with two or more series of commands that may be independently accessed using different start locations for the start command set commands. Accordingly, the memory device 30 may be loaded with multiple command sequences, depending on the specific requirements of an application being executed by the microprocessor 15. It is also contemplated that the command buffer 30 may be used to prioritize commands being sent to the memory device 30 by the microprocessor 15. For example, a low priority command may be loaded into the command buffer 55 instead of being immediately executed. Then, the memory device 30 would be able to process a higher priority command and return to the buffered command as additional resources become available.

The combinations of the logic and address signals present on the external lines 115, 120, 125, and 135 used to implement the load command set, start command set, and stop command set commands are provided for illustrative purposes. Other logic combinations are contemplated.

The memory device 30 includes a look-ahead circuit 205 adapted to evaluate the next two command buffer entries 200 by incrementing the command buffer 55 pointer. Based on the expected next commands, the look-ahead circuit 205 can proactively power up or down portions of the memory device 30 or begin execution of the next command. The number of entries evaluated by the look-ahead circuit 205 may be more or less than the two evaluated in the illustrated embodiment, depending on the specific design requirements of the memory device 30. The look-ahead circuit 205 entries are loaded in parallel with the start command set instruction, and incremented on successive clock cycles.

The operation of the memory device 30 using the command buffer 55 and look-ahead circuit 205 is illustrated by the following examples. For ease of illustration, the first example is described for a look-ahead circuit 205 that looks ahead to only one subsequent instruction. Assume a start command set instruction is received by the memory device 30 with a start address J at time CLK1, and another start command set instruction is given with address K at time CLK5. Waiting instructions are executed and next instructions are loaded on high edges of the clock signal CLK.

At time equal to CLK1, a NOP (no operation) is executed. The instruction from address J is loaded from the command buffer 55. The look-ahead circuit 205 is loaded with the J+1 instruction. At time CLK2, the memory device 30 executes the instruction from J, loads the instruction from J+1, and loads the instruction from J+2 into the look-ahead circuit 205. At time CLK3, the memory device 30 executes the instruction from J+1, loads the instruction from J+2, and loads the instruction from J+3 into the look-ahead circuit 205. At time CLK4, the memory device 30 executes the instruction from J+2, loads the instruction from J+3, and loads the instruction from J+4 into the look-ahead circuit 205.

At time CLK5, when the new start command set instruction is received, the memory device 30 executes the instruction from J+3, loads the new instruction from K, and loads the look-ahead circuit 205 with the instruction from K+1. At time CLK6, the memory device 30 executes the instruction from K, loads the instruction from K+1, and loads the instruction from K+2 into the look-ahead circuit 205. The instruction sequence continues in a similar manner until either a stop command set instruction or a new start command set instruction is received.

The use of the look-ahead circuit 205 to proactively control the memory device 30 is described in a second example. In the second example, the look-ahead circuit 205 evaluates three subsequent instructions to determine where power or speed can be gained. The commands being loaded and evaluated are shown in the following table.

TABLE 1

| Time | Execute Buffer | Look-Ahead 1 | Look-Ahead 2 | Look-Ahead 3 |
|---|---|---|---|---|
| CLK1 (Start J) | J | J + 1 | J + 2 | J + 3 |
| CLK2 | J + 1 | J + 2 | J + 3 | J + 4 |
| CLK3 | J + 2 | J + 3 | J + 4 | J + 5 |
| CLK4 | J + 3 | J + 4 | J + 5 | J + 6 |
| CLK5 (Start K) | K | K + 1 | K + 2 | K + 3 |
| CLK6 | K + 1 | K + 2 | K + 3 | K + 4 |

Collectively, the bank row address latch and decoder 165, the column decoder 170, and the I/O gating, mask logic, read data latch, and write driver unit 175 are referred to as array logic. Due to the sequential manner in which command buffer entries 200 are executed, it is possible for the memory device 30 to predict what commands are expected in the near future. This allows the performance of the chip to be optimized by powering down unneeded array logic (e.g., RAS chain timing for each bank, data path precharging/biasing circuitry for each bank, internal clocks running to banks, etc.) to reduce power consumption or by powering up previously powered down portions to prevent delays.

For example, if the look-ahead circuit 205 determines that the next three instructions are intended for bank 3, the array logic for the other banks can be powered down to reduce power consumption. When an instruction is evaluated that uses one of the other banks, the array logic can be re-powered prior to it being required (i.e., assuming the array logic can be restored in three clock cycles). In a memory device 30 where the array logic takes longer than three cycles to power up, the size of the look-ahead circuit 205 may be increased to evaluate further into the future.

Storing and executing commands from the command buffer 55 as described above decreases the power requirements for the memory device 30 by allowing the logic and address signals to be provided internally by the memory device 30, rather than being externally driven by the system memory controller 25. Also, because the memory device 30 may use the look-ahead circuit 205 to proactively power up or down portions of the memory device 30, the potential for power savings is further increased. In applications, such as graphics applications, where repeating command sequences may be common, this power savings may be significant.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A memory device, comprising:
   a memory array;
   a plurality of external lines for receiving an external command;
   a command buffer adapted to store a plurality of command buffer entries, each command buffer entry having an associated buffered command; and
   control logic coupled to the plurality of external lines and the command buffer and being adapted to receive a first start command set instruction including a first command buffer address on the external lines, execute the buffered command associated with the first command buffer address, execute buffered commands of subsequent command buffer entries sequentially, identify a second start command set instruction including a second command buffer address among the buffered commands, and execute the buffered command associated with the second command buffer address.

2. The memory device of claim 1, wherein the external lines include external address lines and the control logic is adapted to receive the first command buffer address on the external address lines.

3. The memory device of claim 1, wherein the control logic is adapted to execute the buffered commands associated with the plurality of command buffer entries sequentially until a stop command set instruction is received on the external lines.

4. The memory device of claim 1, wherein the control logic is adapted to execute the buffered commands associated with the plurality of command buffer entries sequentially until a stop command set instruction is encountered as one of buffered commands associated with the command buffer entries.

5. The memory device of claim 1, wherein the control logic is adapted to receive a load command set instruction on the external lines and store the command buffer entries in the command buffer in response to the load command set instruction.

6. The memory device of claim 5, wherein the plurality of external lines include external data lines, the command buffer entries are defined by data present on the external data lines, and locations for the command buffer entries in the command buffer are defined by data present on the external address lines.

7. A computer system, comprising:
   a microprocessor adapted to issue a plurality of memory requests;
   a memory controller coupled to the microprocessor and adapted to receive the memory requests and generate memory access commands based on the memory requests;
   a memory device coupled to the memory controller and adapted to receive the memory access commands, the memory device including:
   a memory array;
   a plurality of external lines for receiving an external command;

a command buffer adapted to store a plurality of command buffer entries, each command buffer entry having an associated buffered command; and control logic coupled to the plurality of external lines and the command buffer and being adapted to receive a first start command set instruction including a first command buffer address on the external lines, execute the buffered command associated with the first command buffer address, execute buffered commands of subsequent command buffer entries sequentially, identify a second start command set instruction including a second command buffer address among the buffered commands, and execute the buffered command associated with the second command buffer address.

8. The computer system of claim 7, wherein the external lines include external address lines, and the control logic is adapted to receive the first command buffer address on the external address lines.

9. The computer system of claim 7, wherein the control logic is adapted to execute the buffered commands associated with the plurality of command buffer entries sequentially until a stop command set instruction is received on the external lines.

10. The computer system of claim 7, wherein the control logic is adapted to execute the buffered commands associated with the plurality of command buffer entries sequentially until a stop command set instruction is encountered as one of buffered commands associated with the command buffer entries.

11. The computer system of claim 7, wherein the control logic is adapted to receive a load command set instruction on the external lines and store the command buffer entries in the command buffer in response to the load command set instruction.

12. The computer system of claim 11, wherein the plurality of external lines include external data lines, the command buffer entries are defined by data present on the external data lines, and locations for the command buffer entries in the command buffer are defined by data present on the external address lines.

13. The method of claim 11, further comprising executing the buffered commands associated with the plurality of command buffer entries sequentially until a stop command set instruction is received on the external lines.

14. The method of claim 11, further comprising executing the buffered commands associated with the plurality of command buffer entries sequentially until a stop command set instruction is encountered as one of buffered commands associated with the command buffer entries.

15. The method of claim 11, further comprising:

receiving a load command set instruction on the external lines; and storing the command buffer entries in the command buffer in response to the load command set instruction.

16. The method of claim 15, wherein the plurality of external lines include external address lines and external data lines, and the method further comprises:

receiving the command buffer entries on the external data lines; and receiving locations for the command buffer entries in the command buffer on the external address lines.

17. A method for providing commands to a memory device, the memory device including a command buffer, control logic, a memory array, and external lines, the method comprising:

storing a plurality of command buffer entries, each command buffer entry having an associated buffered commands;

receiving a first start command set instruction including a first command buffer address on the external lines;

executing the buffered command associated with the first command buffer address;

executing buffered commands of subsequent command buffer entries sequentially;

identifying a second start command set instruction including a second command buffer address among the buffered commands; and executing the buffered command associated with the second command buffer address.

18. The method of claim 17, wherein the external lines include external address lines, and receiving the first start command set instruction comprises receiving the first command buffer address on the external address lines.

19. An apparatus comprising:

means for storing data;

means for storing a plurality of command buffer entries, each command buffer entry having an associated buffered command;

means for receiving a first start command set instruction including a first command buffer address;

means for executing the buffered command associated with the first command buffer address;

means for executing buffered commands of subsequent command buffer entries sequentially;

means for identifying a second start command set instruction including a second command buffer address among the buffered commands; and means for executing the buffered command associated with the second command buffer address.

* * * * *